United States Patent
Kim et al.

(10) Patent No.: US 10,869,018 B2
(45) Date of Patent: Dec. 15, 2020

(54) OPTICAL IMAGING SYSTEM FOR 3D IMAGE ACQUISITION APPARATUS AND 3D IMAGE ACQUISITION APPARATUS INCLUDING THE OPTICAL IMAGING SYSTEM

(71) Applicant: SAMSUNG ELECTRONICS CO., LTD., Suwon-si (KR)

(72) Inventors: Kyu Sik Kim, Yongin-si (KR); Yong Hwa Park, Yongin-si (KR); Ryuichi Satoh, Shizuoka (JP); Jang Woo You, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 262 days.

(21) Appl. No.: 15/005,065

(22) Filed: Jan. 25, 2016

(65) Prior Publication Data
US 2016/0227194 A1    Aug. 4, 2016

(30) Foreign Application Priority Data
Jan. 30, 2015 (KR) .................. 10-2015-0015218

(51) Int. Cl.
*H04N 13/239* (2018.01)
*H04N 9/04* (2006.01)
(Continued)

(52) U.S. Cl.
CPC ......... *H04N 13/239* (2018.05); *G01S 7/4816* (2013.01); *G01S 17/08* (2013.01);
(Continued)

(58) Field of Classification Search
CPC .... H04N 13/0239; G01S 17/23; G01S 7/4816
(Continued)

(56) References Cited

U.S. PATENT DOCUMENTS

| 4,651,001 A | * | 3/1987 | Harada ............. H01L 27/14618 250/330 |
| 5,847,758 A | * | 12/1998 | Iizuka .................... H04N 9/045 348/280 |

(Continued)

FOREIGN PATENT DOCUMENTS

| CN | 1270706 A | 10/2000 |
| JP | 2009272620 | 11/2009 |

(Continued)

OTHER PUBLICATIONS

Partial European Search Report of European Application No. 16151927.7 dated Jul. 4, 2016, citing the references listed within.
(Continued)

*Primary Examiner* — Amir Shahnami
(74) *Attorney, Agent, or Firm* — Cantor Colburn LLP

(57) ABSTRACT

An optical imaging system for a three-dimensional image acquisition apparatus includes an object lens which focuses light, a first image sensor which senses light in a visible light band of the light focused by the object lens, and a second image sensor which senses light in an infrared ray band of light transmitted through the first image sensor. A three-dimensional image acquisition apparatus includes the optical imaging system for a three-dimensional image acquisition apparatus.

17 Claims, 9 Drawing Sheets

(51) Int. Cl.

| | | |
|---|---|---|
| *H04N 13/25* | (2018.01) | |
| *H04N 5/225* | (2006.01) | |
| *H04N 5/33* | (2006.01) | |
| *H04N 13/257* | (2018.01) | |
| *H04N 13/296* | (2018.01) | |
| *G01S 17/89* | (2020.01) | |
| *G01S 17/08* | (2006.01) | |
| *G01S 7/481* | (2006.01) | |
| *H04N 13/271* | (2018.01) | |
| *H04N 13/254* | (2018.01) | |
| *G01S 17/86* | (2020.01) | |
| *H01L 27/30* | (2006.01) | |

(52) U.S. Cl.
CPC ............ *G01S 17/86* (2020.01); *G01S 17/89* (2013.01); *H04N 5/2256* (2013.01); *H04N 5/2258* (2013.01); *H04N 5/33* (2013.01); *H04N 5/332* (2013.01); *H04N 9/045* (2013.01); *H04N 13/25* (2018.05); *H04N 13/254* (2018.05); *H04N 13/257* (2018.05); *H04N 13/271* (2018.05); *H04N 13/296* (2018.05); *H01L 27/307* (2013.01)

(58) Field of Classification Search
USPC ......................................................... 348/164
See application file for complete search history.

(56) References Cited

U.S. PATENT DOCUMENTS

| | | | |
|---|---|---|---|
| 6,483,099 B1 | 11/2002 | Yu et al. | |
| 8,368,058 B2 | 2/2013 | Sawaki et al. | |
| 8,436,308 B2 | 5/2013 | Choe et al. | |
| 2007/0201859 A1* | 8/2007 | Sarrat | G03B 35/08 396/322 |
| 2008/0246107 A1* | 10/2008 | Maehara | H01L 27/1462 257/432 |
| 2009/0294761 A1 | 12/2009 | Kim et al. | |
| 2009/0929476 | 12/2009 | Kim et al. | |
| 2011/0052256 A1* | 3/2011 | Arasawa | G03G 21/1842 399/111 |
| 2011/0234893 A1* | 9/2011 | Koseki | H04N 5/2257 348/374 |
| 2012/0098971 A1 | 4/2012 | Hansen et al. | |
| 2012/0162410 A1 | 6/2012 | Vaillant | |
| 2012/0300038 A1* | 11/2012 | You | G02F 1/017 348/47 |
| 2013/0093911 A1 | 4/2013 | Sul et al. | |
| 2013/0011294 A1 | 5/2013 | Lee et al. | |
| 2013/0107005 A1* | 5/2013 | Lim | H04N 5/33 348/46 |
| 2013/0112947 A1 | 5/2013 | Lee et al. | |
| 2013/0320309 A1 | 12/2013 | Kim et al. | |
| 2014/0008619 A1 | 1/2014 | Lee et al. | |
| 2014/0070183 A1 | 3/2014 | Park et al. | |
| 2014/0070189 A1 | 3/2014 | Leem et al. | |
| 2014/0097416 A1 | 4/2014 | Lee et al. | |
| 2014/0098192 A1 | 4/2014 | Park et al. | |
| 2014/0117321 A1 | 5/2014 | Lim et al. | |
| 2015/0304582 A1* | 10/2015 | Hirota | H04N 5/378 348/49 |

FOREIGN PATENT DOCUMENTS

| | | | | |
|---|---|---|---|---|
| JP | 2009272620 A | * | 11/2009 | ....... H01L 27/14647 |
| KR | 20110052256 A | * | 5/2011 | |
| KR | 1020110052256 A | | 5/2011 | |
| KR | 1020110101435 A | | 9/2011 | |
| KR | 1020130014222 A | | 2/2013 | |
| KR | 1020140041548 A | | 4/2014 | |
| WO | 9909603 | | 2/1999 | |
| WO | WO 1999009603 A1 | * | 2/1999 | |
| WO | 2012157730 A1 | | 11/2012 | |
| WO | 2012457730 A1 | | 11/2012 | |
| WO | 2014204111 | | 12/2014 | |

OTHER PUBLICATIONS

Toshikatsu Sakai et al., "Color Image Sensor Using Stacked Organic Photoconductive Films with Transparent Readout Circuits Separated by Thin Interlayer Insulator", Proc. of SPIE-IS&T, vol. 9022, pp. 90220J-1-90220J-7.
Search Report for KR Application No. 10-2015-0015218, Filing Date Jan. 30, 2015; Report dated Jun. 16, 2014; 8 pages.
Yong-Hwa Park, et al.; A Robust Design and Fabrication of Micromachined Electro-Absorptive Optical Modulator for 3D Imaging; Proc. of SPIE, vol. 8977, 89770C, pp. 1-14.
Yong-Hwa Park, et al.; Three-Dimensional Imaging Using Fast Micromachined Electro-Absorptive Shutter; J. Micro/Nanolith., MEMS, MOEMS, vol. 12(2), 023011, Apr.-Jun. 2013, pp. 1-11.
European Search Report—European Patent Application No. 16151927.7 dated Nov. 23, 2016, citing references listed within.
Chinese Office Action for Application No. 201610028856.9 dated Oct. 31, 2017.
Office Action—Korean Patent Application No. 10-2015-0015218 dated Oct. 12, 2020, citing references listed within.

\* cited by examiner

FIG. 4

| B | G | R | G |
|---|---|---|---|
| G | R | B | R |
| B | G | R | G |
| G | R | B | R |

Passage of Light

OPTICAL IMAGING SYSTEM FOR 3D IMAGE ACQUISITION APPARATUS AND 3D IMAGE ACQUISITION APPARATUS INCLUDING THE OPTICAL IMAGING SYSTEM

CROSS-REFERENCE TO RELATED APPLICATIONS

This application claims priority to Korean Patent Application No. 10-2015-0015218 filed on Jan. 30, 2015, and all the benefits accruing therefrom under 35 U.S.C. § 119, the content of which in its entirety is herein incorporated by reference.

BACKGROUND

1. Field

Embodiments of the invention relate to an optical imaging system for a three-dimensional ("3D") image acquisition apparatus and a 3D image acquisition apparatus including the optical imaging system.

2. Description of the Related Art

Recently, research has been undertaken in the field of 3D content because of development and increased demand for 3D display apparatuses capable of displaying an image having a sense of depth. Accordingly, research is being conducted into various 3D image acquisition apparatuses that enable users to produce 3D content. Such a 3D camera may be used to obtain depth information as well as conventional two-dimensional ("2D") color image information at the same time.

A binocular stereo vision method, which uses two cameras, or a triangulation method using structured light and a camera may be used to obtain depth information regarding distances between a 3D image acquisition apparatus and surfaces of an object. However, in such a method, accurate depth information may not be effectively obtained because the accuracy of depth information depends on the surface state of an object and degrades rapidly as the distance to the object increases.

In order to improve accuracy of depth information, a time-of-flight ("TOF") method may be used. TOF technology is a method of measuring the flight time of light until the light reflected from an object is received by a light-receiving part unit after illumination light is irradiated onto the object. According to the TOF technology, an illumination optical system, including a light-emitting diode ("LED") or a laser diode ("LD"), is used to project light of a predetermined wavelength (e.g., 850 nm near infrared rays) onto an object, and light of the same wavelength reflected from the object is received by a light-receiving part. Then, a series of processing operations, such as modulation of the received light by an optical shutter having a known gain waveform, are performed to extract depth information. Various TOF technologies have been introduced according to the series of optical processing operations.

A 3D image acquisition apparatus employing a TOF technology typically includes an illumination optical system for emitting illumination light and an optical imaging system for acquiring an image of an object to obtain depth information. The optical imaging system generates a general color image by sensing visible light reflected from the object and simultaneously generates a depth image only having depth information by sensing illumination light reflected from the object. Accordingly, the optical imaging system may include an object lens and an image sensor for visible light, and an object lens and an image sensor for illumination light (i.e., a two-lens and two-sensor structure). However, in the two-lens and two-sensor structure, a color image and a depth image have different fields of view, and thus, a separate process is performed to accurately match the two images. Accordingly, a size of the 3D camera and the manufacturing cost thereof are increased.

SUMMARY

A three-dimensional ("3D") camera having one common object lens and two image sensors (i.e., a one-lens and two-sensor structure) has been suggested to reduce the size and the manufacturing cost thereof. In an optical imaging system using a 3D camera having one-lens and two-sensor structure, the volume and weight of the optical imaging system including the 3D camera may be increased and the manufacturing costs thereof may be increased.

Embodiments of the invention provide an optical imaging system capable of manufacturing a smaller 3D image acquisition apparatus having one pair of common object lens and two image sensors in a simpler process.

Embodiments of the invention provide a 3D image acquisition apparatus including the optical imaging system.

According to an embodiment of the invention, an optical imaging system for a 3D image acquisition apparatus includes: a common object lens which focuses light; a first image sensor which senses light in a visible light band of the light focused by the object lens; and a second image sensor which senses light in an infrared ray band of light transmitted through the first image sensor.

In an embodiment, the first image sensor may include an organic image sensor in which a plurality of pixel parts are defined, where the organic image sensor may include a plurality of second pixel electrodes arranged apart from each other and corresponding to the plurality of pixel parts; a photoactive layer disposed on the second pixel electrodes in a form of a continuous film, including an organic light-absorbing material which senses light substantially in a full visible light region and overlapping the plurality of pixel parts; a first pixel electrode disposed on the photoactive layer in a form of a consecutive film and overlapping the plurality of pixel parts, and disposed at a light incidence side; and a plurality of color filters disposed on the first pixel electrode in positions corresponding to the plurality of pixel parts, and each of which transmits light in a certain wavelength region to be sensed by a pixel part corresponding thereto.

In an embodiment, the plurality of color filters may include a first color filter, a second color filter and a third color filter, the first color filter may selectively transmit light having a wavelength in a range of about 400 nm to about 500 nanometers (nm), the second color filter may selectively transmit light having a wavelength in a range of about 500 nm to about 580 nm, and the third color filter may selectively transmit light having a wavelength in a range of about 580 nm to about 700 nm.

In an embodiment, the first image sensor includes blue pixel, green pixel, and red pixel. In such an embodiment, each of the blue pixel, green pixel and the red pixel may include: a first light-transmitting electrode disposed at a light incidence side; a second light-transmitting electrode facing the first light-transmitting electrode; and a photoactive layer interposed between the first light-transmitting electrode and the second light-transmitting electrode, where the photoactive layer of the blue pixel may include an organic material which absorbs light in a blue wavelength region, the photoactive layer of the green pixel may include an organic material which absorbs light in a green wavelength region, and the photoactive layer of the red pixel may include an organic material which absorbs light in a red wavelength region.

In an embodiment, the blue pixel, the green pixel and the red pixel may be horizontally adjacent to each other.

In an embodiment, two color pixels of the blue pixel, the green pixel and the red pixel may be horizontally adjacent to each other, and the other color pixel of the blue pixel, the green pixel and the red pixel may be vertically disposed on a layer defined by the two color pixels of the blue pixel, the green pixel and the red pixel.

In an embodiment, the blue pixel and the red pixel may be horizontally adjacent to each other, and the green pixel may be vertically disposed on a layer defined by the blue pixel and the red pixel.

In an embodiment, the blue pixel, the green pixel and the red pixel may be vertically disposed one on another.

In an embodiment, the blue pixel, the green pixel and the red pixel may be vertically and sequentially disposed one on another from the object lens.

In an embodiment, the organic material of the photoactive layer of the blue pixel may have a maximum absorption wavelength (λmax) in a range of about 400 nm to about 500 nm, the organic material of the photoactive layer of the green pixel may have a maximum absorption wavelength (λmax) in a range of about 500 nm to about 580 nm, and the organic material of the photoactive layer of the red pixel may have a maximum absorption wavelength (λmax) in a range of about 580 nm to about 700 nm.

In an embodiment, the second image sensor may include a first light-transmitting electrode disposed at a light incidence side, a second light-transmitting electrode facing the first light-transmitting electrode, and a photoactive layer interposed between the first light-transmitting electrode and the second light-transmitting electrode and including an organic material which absorbs the light in the infrared ray band.

In an embodiment, the second image sensor may include a silicon photodiode which senses the light in the infrared ray band.

In another embodiment of the invention, the optical imaging system may further include an optical shutter module disposed between the first image sensor and the second image sensor and which transmits the light in the infrared ray band of the light transmitted through the first image sensor.

In an embodiment, the optical shutter module may include an optical shutter that modulates the light in the infrared ray band into a predetermined gain waveform.

In an embodiment, the optical shutter module may further include a wavelength selectivity mirror disposed on the optical shutter and which reflects the light in the visible light band and transmits the light in the infrared ray band.

In an embodiment, the first image sensor, the optical shutter module, and the second image sensor may be sequentially arranged to be substantially perpendicular to an optical axis along the optical axis.

In another embodiment of the invention, a 3D image acquisition apparatus includes: the optical imaging system described herein; a light source which generates the light in the infrared ray band and irradiates the light in the infrared ray band onto an object; a video signal processor which generates a 3D image using first and second video signals respectively from the first image sensor and the second image sensor of the optical imaging system; and a controller which controls operations of the light source and the video signal processor.

In another embodiment of the invention, a 3D camera including the 3D image acquisition apparatus described herein is provided.

In another embodiment of the invention, a range-finding device including the 3D image acquisition apparatus described herein is provided.

In another embodiment of the invention, a gesture recognizer including the 3D image acquisition apparatus described herein is provided.

In another embodiment of the invention, a game console including the 3D image acquisition apparatus described herein is provided.

BRIEF DESCRIPTION OF THE DRAWINGS

These and/or other features of the invention will become apparent and more readily appreciated from the following detailed description of embodiments thereof, taken in conjunction with the accompanying drawings, in which:

FIG. 4 is a schematic top plan view of another alternative embodiment of a first image sensor in the optical imaging system for a 3D image acquisition apparatus shown in FIGS. 2 and 3;

DETAILED DESCRIPTION

Figure 1:
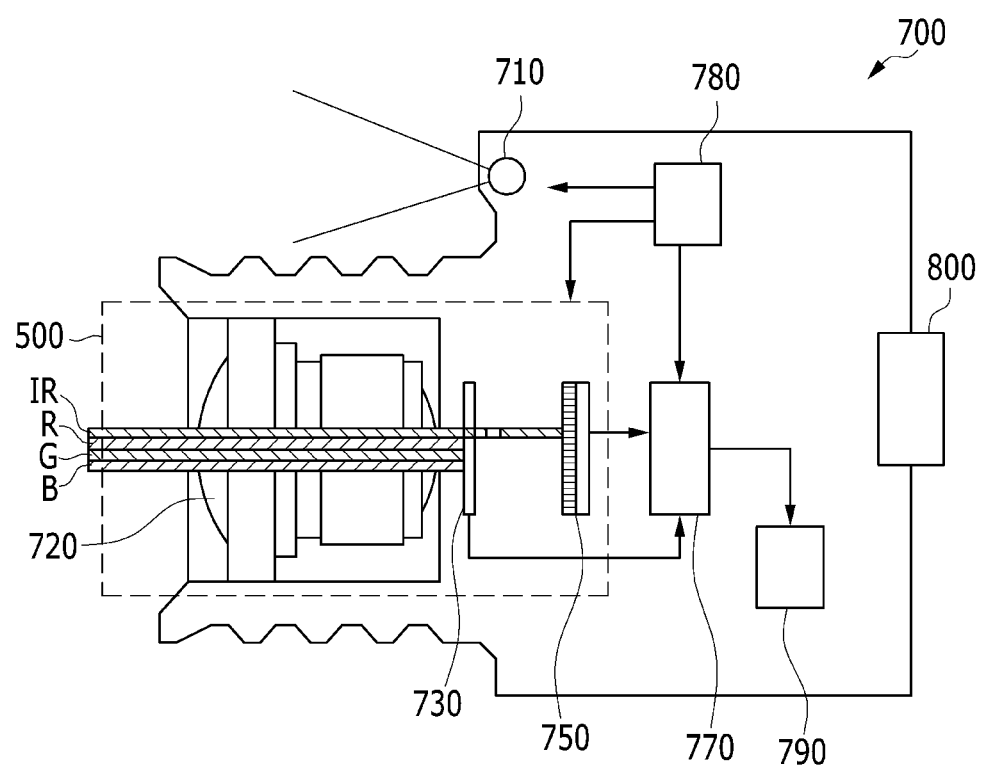
FIG. 1 is a schematic view showing structures of an embodiment of an optical imaging system for a three-dimensional ("3D") image acquisition apparatus and an embodiment of a 3D image acquisition apparatus including the optical system, according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example In an exemplary embodiment, if when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, referring to drawings, a first image sensor, a second image sensor, and an optical shutter module of an optical imaging system for a three-dimensional ("3D") image acquisition apparatus according to one embodiment and a 3D image acquisition apparatus including the same, and the optical imaging system for a 3D image acquisition apparatus, are explained.

In the following drawings, like reference numerals designate like constituent elements, and sizes of constituent elements may be exaggerated for clarity and for convenience. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, embodiments of the invention will be described in detail with reference to the accompanying drawings.

FIG. 1 is a schematic view showing structures of an embodiment of an optical imaging system for a 3D image acquisition apparatus and an embodiment of a 3D image acquisition apparatus including the optical imaging system, according to the invention.

Referring to FIG. 1, an embodiment of a 3D image acquisition apparatus 700 according to the invention includes a light source 710 that generates illumination light having a predetermined wavelength, an object lens 720 that focuses visible light and the illumination light reflected from an external object (not shown), a first image sensor 730 that senses visible light focused by the object lens 720 and generates a color image, a second image sensor 750 that senses illumination light transmitted from the first image sensor 730 and generates a depth image, a video signal processor 770 that generates 3D image using the color image and depth image, and a controller 780 that controls operations of the light source 710, the first image sensor 730, the second image sensor 750 and the video signal processor 770. In an embodiment, the 3D image acquisition apparatus 700 may further include a memory 790 for storing a final 3D image and a display panel 800 for displaying the final 3D image.

In an embodiment, the light source 710 may include a light-emitting diode ("LED") or a laser-diode ("LD"), which is capable of emitting illumination light that has a near infrared ray ("NIR") wavelength of about 850 nanometers (nm) for safety purposes and is invisible to the human eyes, but not being limited thereto. In an alternative embodiment, illumination light in an appropriate different wavelength band and a different type of light source may be used according to design requirements. In an embodiment, the light source 710 may emit illumination light in various forms, for example, a sine wave, a ramp wave or a square wave, which has a predefined wavelength, in response to a control signal received from the controller 780.

In an embodiment, as shown in FIG. 1 as indicated as a dotted line, the object lens 720, the first image sensor 730, and the second image sensor 750 may define an optical imaging system 500 of the 3D image acquisition apparatus 700. For convenience of illustration, FIG. 1 illustrates the object lens 720 having a simple structure, but not being limited thereto. In such an embodiment, the object lens 720 may be a zoom lens including a plurality of lens groups.

In an embodiment, as described above, light in a visible light region (e.g., red light R, green light G and blue light B shown in FIG. 1) of light focused by the object lens 720 is sensed by the first image sensor 730 to generate a color image. As described above, referring to FIGS. 2 to 6, the first image sensor 730 may include one or more pixel parts, particularly color pixels including an organic photoelectric device including a material sensing light in a visible light region. Accordingly, light in a visible light region of light focused by the object lens 720 is mainly absorbed by organic photoelectric devices of the first image sensor 730 including a material selectively absorbs light in a visible light region, and light in an infrared region of other light except visible light, for example, light in a near infrared region (e.g., infrared ray IR shown in FIG. 1), that is, a wavelength range of about 700 nm to about 1100 nm, or a wavelength range of about 800 nm to about 1100 nm, is absorbed by the second image sensor 750 that senses light in an infrared region to produce a depth image.

In such an embodiment, since the first image sensor 730 that senses visible light is disposed right behind the object lens 720, and the second image sensor 750 that senses infrared light is disposed right behind the first image sensor 730, the optical imaging system 500 for the 3D image acquisition apparatus 700 may operate without a separate complicated constitution for separating the visible light from the infrared light. In such an embodiment, the first image sensor 730 includes a material that selectively absorbs and senses the visible light, and thus the light transmitted through the first image sensor 730 rarely includes the visible light, while the light other than visible light, e.g., the infrared light, enters the second image sensor 750. In such an embodiment, since the second image sensor 750 selectively senses only the infrared light, the optical imaging system 500 for the 3D image acquisition apparatus effectively operates without a separate constitution for separating the visible light and the infrared light from the incident light, and thus the optical imaging system 500 and a 3D image acquisition apparatus including the optical imaging system 500 may have a reduced size, e.g., a thin thickness. In such an embodiment, the manufacturing cost of the optical imaging system 500 or the 3D image acquisition apparatus including the optical imaging system 500 may be reduced, and the optical efficiency thereof may be increased.

Hereinafter, various embodiments of the first image sensor 730 of the optical imaging system 500 of the 3D image acquisition apparatus 700 shown in FIG. 1 will be described referring to FIGS. 2 to 6.

Figure 2:
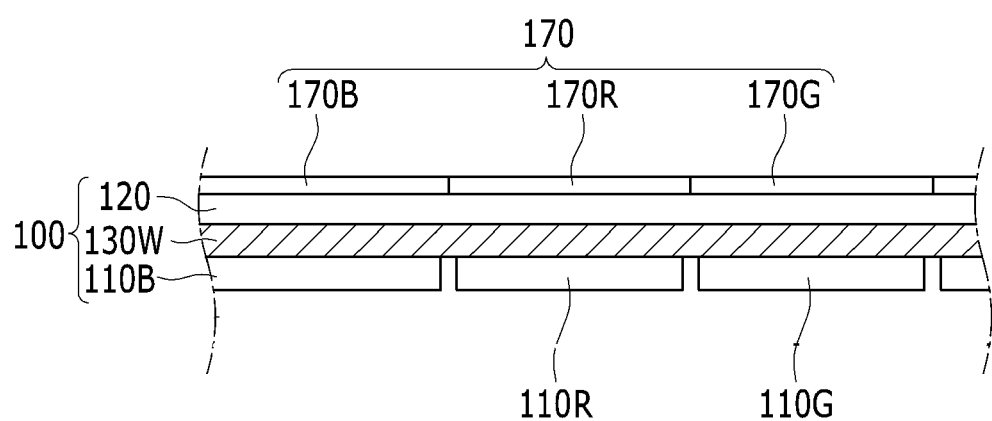
FIG. 2 is a schematic view of an embodiment of a first image sensor in an optical imaging system for a 3D image acquisition apparatus, according to the invention.

In an embodiment, as shown in FIG. 2, the first image sensor 730 included in the optical imaging system 500 includes a plurality of pixel parts 100 that senses light in a visible light band, and the plurality of pixel parts respectively include a photoelectric device including an organic material that senses light in a certain or specific visible light region.

FIG. 2 is a cross-sectional view schematically showing an embodiment of the first image sensor 730 according to the invention, which includes a first pixel electrode 120 disposed at an incident side, second pixel electrodes 110B, 110R and 110G facing the first pixel electrode and disposed separately pixel by pixel, a photoactive layer 130W disposed between the first pixel electrode 120 and the second pixel electrodes 110B, 110R and 110G, and including an organic material that absorbs light in the full wavelength region of a visible light band, and a plurality of color filters 170B, 170R and 170G disposed corresponding to the pixels on the first pixel electrode 120. In such an embodiment, as shown in FIG. 2, the first pixel electrode 120 and the photoactive layer 130W may have a continuous film shape that overlaps all of the second pixel electrodes 110B, 110R and 110G.

Hereinafter, a constituent element including 'B' in the reference symbol refers to a constituent element that defines a blue pixel, a constituent element including 'G' in the reference symbol refers to a constituent element that defines a green pixel, and a constituent element including 'R' in the reference symbol refers to a constituent element that defines a red pixel.

In an embodiment, the color filter 170B is a blue color filter that selectively transmits light having a wavelength in a range from about 400 nm to about 500 nm, the color filter 170G is a green color filter that selectively transmits light having a wavelength in a range from about 500 nm to about 580 nm, and the color filter 170R is a red color filter that selectively transmits light having a wavelength in a range from greater than about 580 nm to about 700 nm.

Each of the first pixel electrode 120 and the second pixel electrodes 110B, 110G and 110R is a transparent electrode, and thus the first image sensor 730 may selectively absorb light in a certain or specific wavelength region of the visible light band by each pixel and transmit the rest of light including infrared light therethrough.

The first pixel electrode 120 and the second pixel electrodes 110B, 110G, and 110R may be a light-transmitting electrode for an organic photoelectric device used to manufacture an image sensor. In one embodiment, for example, the first pixel electrode 120 and second pixel electrodes 110B, 110G and 110R may include, for example, a transparent conductor such as indium tin oxide ("ITO"), indium zinc oxide ("IZO"), zinc oxide (ZnO), tin oxide (SnO), aluminum tin oxide ("AlTO"), and fluorine doped tin oxide ("FTO"), or may include a metal thin film having a thin thickness of several nanometers or several tens of nanometers, a metal thin film having a thin thickness of several nanometers to several tens of nanometers doped with a metal oxide, a conductive polymer electrode, or a combination thereof.

The photoactive layer 130W including an organic material that absorbs light in the full wavelength region of the visible light band may absorb light substantially in a full visible light region, e.g., light having a wavelength in a range from about 400 nm to about 700 nm. The photoactive layer 130W may include a p-type semiconductor material and an n-type semiconductor material, and at least one of the p-type semiconductor material and the n-type semiconductor material may, for example, absorb light in the full visible light region.

The photoactive layer 130W may include, for example, at least two selected from polyaniline; polypyrrole; polythiophene; poly(p-phenylenevinylene); benzodithiophene; thienothiophene; poly[2-methoxy-5-(2'-ethyl-hexyloxy)-1,4-phenylene vinylene] ("MEH-PPV"); poly[2-methoxy-5-(3,7-dimethyloctyloxy)-1,4-phenylene-vinylene] ("MDMO-PPV"); pentacene; perylene; poly(3,4-ethylenedioxythiophene) ("PEDOT"), poly(3- alkylthiophene); poly((4,8-bis(octyloxy)benzo[1,2-b:4,5-b] dithiophene)-2,6-diyl-alt-(2-((dodecyloxy)carbonyl)thieno [3,4-b]thiophene)-3,6-diyl) ("PTB1"), poly((4,8-bis(2-ethylhexyloxy)benzo[1,2-b:4,5-b']dithiophene)-2,6-diyl-alt-(2-((2-ethylhexyloxy)carbonyl)-3-fluorothieno[3,4-b] thiophene)-3,6-diyl) ("PTB7"); phthalocyanine; tin(II) phthalocyanine (SnPc); copper phthalocyanine; triarylamine; benzidine; pyrazoline; styrylamine; hydrazone; carbazole; thiophene; 3,4-ethylenedioxythiophene ("EDOT"); pyrrole; phenanthrene; tetracene; naphthalene; rubrene; 1,4, 5,8-naphthalene-tetracarboxylic dianhydride ("NTCDA"); tris-(8-hydroxyquinoline) aluminum ("Alq3"), fullerene (e.g., C60, C70, C74, C76, C78, C82, C84, C720, C860, and the like); 1-(3-methoxy-carbonyl)propyl-1-phenyl(6,6)C61 ("PCBM"), fullerene derivatives such as C71-PCBM, C84-PCBM, and bis-PCBM, inorganic semiconductors such as CdS, CdTe, CdSe, and ZnO; a derivative thereof; and a copolymer thereof, without limitation.

The color filters 170B, 170R and 170G respectively transmit light in a certain or specific wavelength region out of light focused through the object lens 720 on the first pixel electrode 120, so that the photoactive layer 130W that absorbs light in the full wavelength region of visible light and is disposed below each color filter 170B, 170R and 170G may selectively absorb and sense light transmitted from a color filter corresponding thereto and convert the absorbed light into an electrical signal through the second pixel electrodes 110B, 110G and 110R disposed below the photoactive layer 130W. Accordingly, each pixel effectively senses light in a certain or specific wavelength region corresponding thereto and outputs a corresponding electrical signal. The output electrical signal may be transmitted to a transparent thin film transistor ("TFT") for transparency of a first image sensor 730 and transferred to a video signal processor 770 disposed in the 3D image acquisition apparatus 700 shown in FIG. 1 based on the electrical signal from each pixel.

Figure 3:
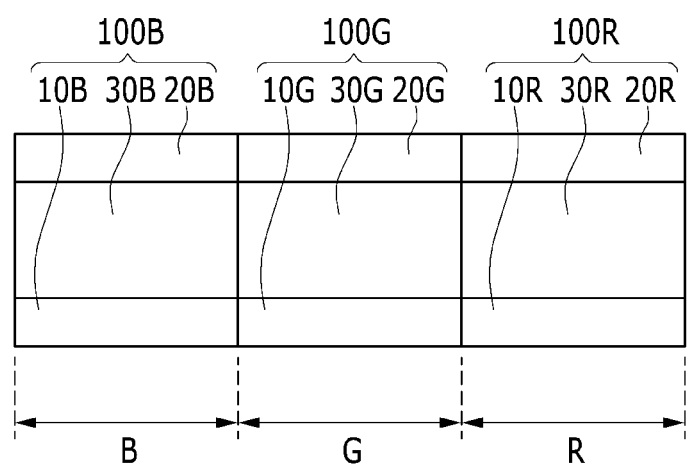
FIG. 3 is a schematic view of an alternative embodiment of a first image sensor in an optical imaging system for a 3D image acquisition apparatus, according to the invention.

FIG. 3 shows an alternative embodiment of a first image sensor 730 of an optical imaging system 500 for a 3D image acquisition apparatus 700 shown in FIG. 1.

In such an embodiment, the first image sensor 730 of the optical imaging system 500 includes a plurality of pixels that senses light in a visible light band, and the plurality of pixels include photoelectric devices, each including an organic material that senses light in a certain or specific visible light region corresponding thereto.

In such an embodiment, as shown in FIG. 3, a first image sensor includes a blue pixel 100B, a green pixel 100G and a red pixel 1000, first light-transmitting electrodes 20B, 20G and 20R disposed at a light incidence side, second light-transmitting electrodes 10B, 10G and 10R facing the first light-transmitting electrodes 20B, 20G and 20R, respectively, and photoactive layers 30B, 30G, and 30R disposed between the first light-transmitting electrodes 20B, 20G and 20R, and the second light-transmitting electrodes 10B, 10G and 10R and each including an organic material that absorbs light in a certain or specific wavelength region corresponding thereto, and such pixels are horizontally arranged in a same layer.

In such an embodiment, as shown in FIG. 3, a color filter on the first light-transmitting electrodes 20B, 20G and 20R may be omitted. In an embodiment shown in FIG. 2, the photoactive layer 130W includes or is formed of a material that absorbs light in the full wavelength region of visible light for the first image sensor, and thus a color filter for transmitting light in a certain or specific wavelength region is disposed on a first light-transmitting electrode through which light enters to absorb light in a certain or specific wavelength region corresponding to each pixel. However, in an embodiment shown in FIG. 3, each pixel respectively includes one of the photoactive layers 30B, 30G and 30R that selectively absorb light in different wavelength regions from each other such that a color filter may be omitted.

The photoactive layer 30B of the blue pixel 100B may include a p-type semiconductor material that selectively absorbs light in a blue wavelength region and an n-type semiconductor material that selectively absorbs light in a blue wavelength region, the photoactive layer 30G of the green pixel 100G may include a p-type semiconductor material that selectively absorbs light in a green wavelength region and an n-type semiconductor material that selectively absorbs light in a green wavelength region, and the photoactive layer 30R of the red pixel 100R may include a p-type semiconductor material that selectively absorbs light in a red wavelength region and an n-type semiconductor material that selectively absorbs light in a red wavelength region.

In an embodiment of the first image sensor shown in FIG. 3, the first light-transmitting electrodes 20B, 20G and 20R, and the second light-transmitting electrodes 10B, 10G and 10R may include the same materials as the first pixel electrodes 120 and the second pixel electrodes 110B, 110R, and 110G of the first image sensor shown in FIG. 2, and thus any repetitive detailed description thereof will be omitted.

Figure 4:
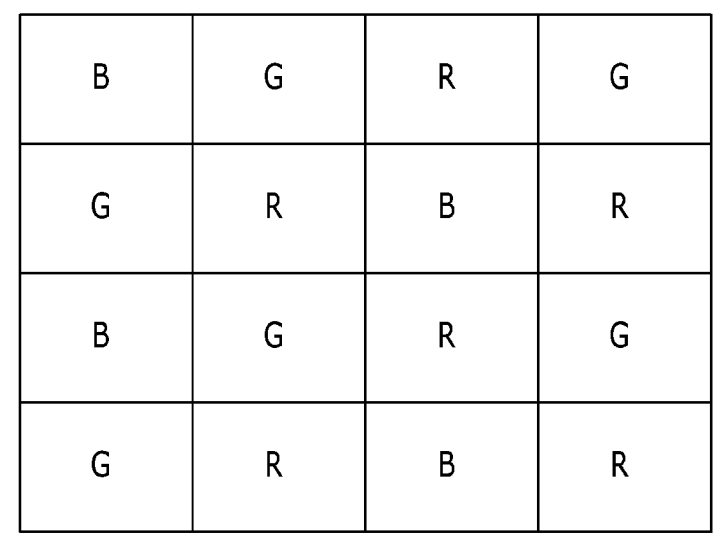

FIG. 4 is a plan view schematically showing arrangement of pixels in an embodiment of the first image sensor shown in FIG. 2 or 3. Such an embodiment of the first image sensor shown in FIG. 2 or 3 may have a same shape in the plan view. In such an embodiment, as shown in FIG. 2, each pixel of the first image sensor may be defined or partitioned by the color fillers 170B, 170R and 170G that transmit light in a certain or specific wavelength region that the pixel senses, or as shown in FIG. 3, each pixel of the first image sensor may be defined or partitioned by each pixel itself 100B, 100G and 100R or the first light-transmitting electrodes 20B, 20G and 20R.

Figure 5:
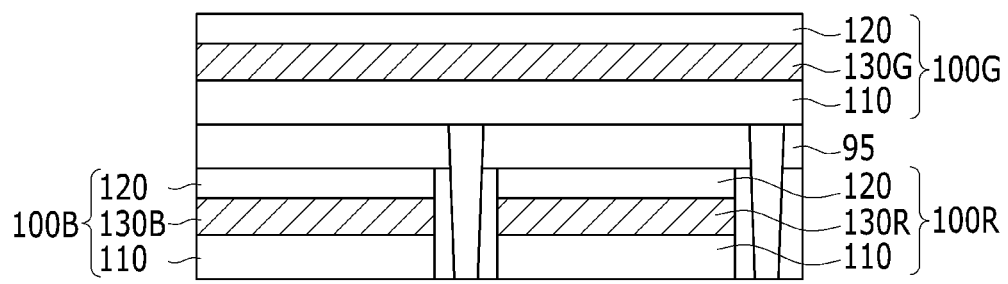
FIG. 5 is a schematic view of yet another alternative embodiment of a first image sensor in the optical imaging system for a 3D image acquisition apparatus, according to the invention.

FIG. 5 is a view schematically showing another alternative embodiment of the first image sensor 730 of the optical imaging system 500 in the 3D image acquisition apparatus 700 shown in FIG. 1.

In an embodiment, as shown in FIG. 5, the first image sensor includes a blue pixel 100B, a red pixel 100R and a green pixel 100G. In such an embodiment, as shown in FIG. 5, the blue pixel 100B and the red pixel 100R may be horizontally disposed or arranged with respect to each other in a same layer, while the green pixel 1000 may be vertically disposed or stacked on the horizontally-arranged blue pixel 100B and red pixel 100R. The blue pixel 100B, the red pixel 100R and the green pixel 100G may each include an organic photoelectric device.

In such an embodiment, the blue pixel 100B may include a first light-transmitting electrode 120 disposed at a light incidence side, a second light-transmitting electrode 110 facing the first light-transmitting electrode 120, and a photoactive layer 130B disposed between the first light-transmitting electrode 120 and the second light-transmitting electrode 110 and including an organic material that absorbs light in a blue wavelength region. In such an embodiment, the red pixel 100R may include a first light-transmitting electrode 120 disposed at a light incidence side, a second light-transmitting electrode 110 facing the first light-transmitting electrode 120, and a photoactive layer 130R disposed between the first light-transmitting electrode 120 and the second light-transmitting electrode 110 and including an organic material that absorbs light in a red wavelength region. In such an embodiment, the green pixel 100G may include a first light-transmitting electrode 120 disposed at a light incidence side, a second light-transmitting electrode 110 facing the first light-transmitting electrode 120, and a photoactive layer 130G disposed between the first light-transmitting electrode 120 and the second light-transmitting electrode 110 and including an organic material that absorbs light in a red wavelength region. In such an embodiment, the organic material of the photoactive layer of the blue pixel may have a maximum absorption wavelength ($\lambda$max) in a range of about 400 nm to about 500 nm, the organic material of the photoactive layer of the green pixel may have a maximum absorption wavelength ($\lambda$max) in a range of about 500 nm to about 580 nm, and the organic material of the photoactive layer of the red pixel may have a maximum absorption wavelength ($\lambda$max) in a range of about 580 nm to about 700 nm.

The photoactive layer 130B of the blue pixel may include a p-type semiconductor material that selectively absorbs light in a blue wavelength region and an n-type semiconductor material that selectively absorbs light in a blue wavelength region, the photoactive layer 130R of the red pixel may include a p-type semiconductor material that selectively absorbs light in a red wavelength region and an n-type semiconductor material that selectively absorbs light in a red wavelength region, and the photoactive layer 130G of the green pixel may include a p-type semiconductor material that selectively absorbs light in a green wavelength region and an n-type semiconductor material that selectively absorbs light in a green wavelength region.

The first light-transmitting electrode 120 and the second light-transmitting electrode 110 of each pixel in the first image sensor shown in FIG. 5 are substantially the same as the first pixel electrode 120 and the second pixel electrodes 110B, 110R and 110G of the first image sensor shown in FIG. 2, and any repetitive detailed description thereof will be omitted.

FIG. 5 shows an embodiment having a structure in which the blue pixel 100B and the red pixel 100R are horizontally disposed, and the green pixel 100G is vertically disposed or stacked thereon, but it is not limited thereto. In an alternative embodiment, the first image sensor may have another structure in which any two pixels of the blue pixel 100B, the red pixel 100R and the green pixel 100G are arranged horizontally side by side in a same layer, and the other pixel of the blue pixel 100B, the red pixel 100R and the green pixel 100G is vertically disposed thereon, e.g., on the same layer defined by the two pixels of the blue pixel 100B, the red pixel 100R and the green pixel 100G.

Figure 6:
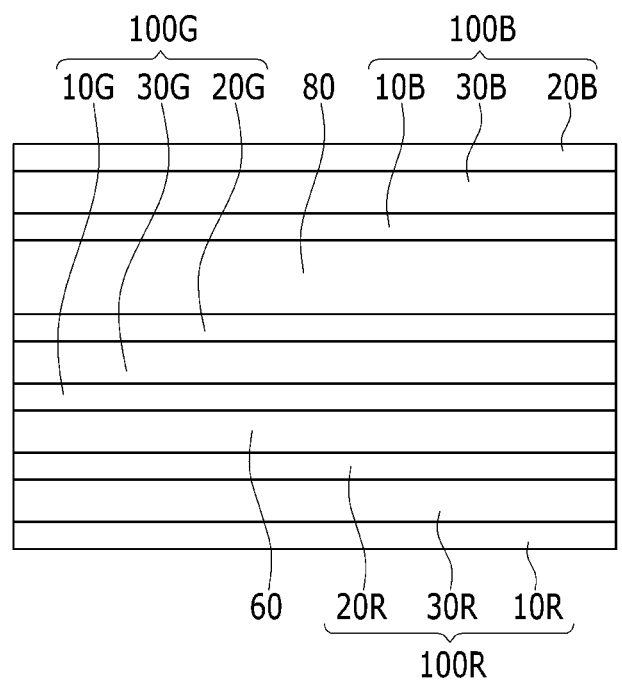
FIG. 6 is a schematic view of still another alternative embodiment of a first image sensor in the optical imaging system for a 3D image acquisition apparatus, according to the invention.

FIG. 6 shows another alternative embodiment of the first image sensor 730 of the optical imaging system 500 of the 3D image acquisition apparatus 700 shown in FIG. 1.

In an embodiment, as shown in FIG. 6, the first image sensor includes an organic photoelectric device including a pixel including a photoactive layer that absorbs and senses light in a certain or specific wavelength region corresponding thereto. The light in each wavelength region respectively sensed by these photoelectric devices is converted into an electrical signal through the second light-transmitting electrode in each device, and thus each pixel may respectively sense the light in a certain or specific wavelength region corresponding thereto and output the electrical signal corresponding to the sensed light. The output electrical signal is transferred to the video signal processor 770 in the 3D image acquisition apparatus 700 of FIG. 1 and may generate a color image based on the electrical signal from each pixel.

Referring to FIG. 6, an embodiment of the first image sensor includes a blue pixel 100B, a green pixel 100G and a red pixel 100R, and has a structure in which the blue pixel 100B, the green pixel 100G and the red pixel 100R are sequentially vertically disposed, e.g., stacked. The blue pixel 100B, green pixel 100G and red pixel 100R may each be an organic photoelectric device.

In such an embodiment, the blue pixel 100B includes a first light-transmitting electrode 20B disposed at a light incidence side, a second light-transmitting electrode 10B facing the first light-transmitting electrode 20B, and a photoactive layer 30B disposed between the first light-transmitting electrode 20B and the second light-transmitting electrode 10B and including an organic material that absorbs light in a blue wavelength region. In such an embodiment, the green pixel 100G includes a first light-transmitting electrode 20G disposed at a light incidence side, a second light-transmitting electrode 10G facing the first light-transmitting electrode 20G, and a photoactive layer 30G disposed between the first light-transmitting electrode 20G and the second light-transmitting electrode 10G and including an organic material that absorbs light in a green wavelength region. In such an embodiment, the red pixel 100R includes a first light-transmitting electrode 20R disposed at a light incidence side, a second light-transmitting electrode 10R facing the first light-transmitting electrode 20R, and a photoactive layer 30R disposed between the first light-transmitting electrode 20R and the second light-transmitting electrode 10R and including an organic material that absorbs light in a red wavelength region.

The photoactive layer 30B of the blue pixel 100B may include a p-type semiconductor material that selectively absorbs light in a blue wavelength region and an n-type semiconductor material selectively absorb light in a blue wavelength region, the photoactive layer 30G of the green pixel 100G may include a p-type semiconductor material that selectively absorbs light in a green wavelength region and an n-type semiconductor material that selectively absorbs light in a green wavelength region, and the photoactive layer 30R of the red pixel 100R may include a p-type semiconductor material that selectively absorbs light in a red wavelength region and an n-type semiconductor material that selectively absorbs light in a red wavelength region.

In an embodiment of the first image sensor shown in FIG. 6, the red pixel 100R, the green pixel 100G and the blue pixel 100B are sequentially vertically disposed one on another from bottom to top, but is not limited thereto. In an alternative embodiment, the blue pixel, the green pixel and the red pixel may be vertically disposed or stacked in a different order.

The first light-transmitting electrodes 20B, 20G, and 20R, and the second light-transmitting electrodes 10B, 10G, and 10R of the first image sensor shown in FIG. 6 may be substantially the same as the first pixel electrode 120 and the second pixel electrodes 110B, 110R and 110G of the first image sensor illustrated in FIG. 2, and any repetitive detailed description thereof will be omitted.

Figure 7:
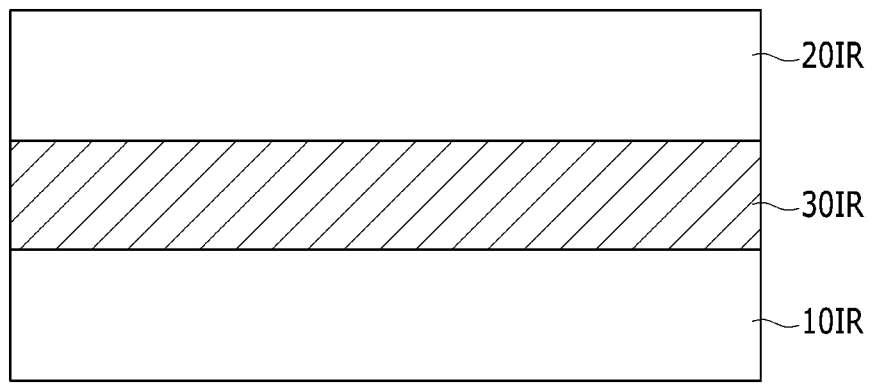
FIG. 7 is a schematic view of an embodiment of a second image sensor in the optical imaging system for a 3D image acquisition apparatus, according to the invention.

In an embodiment, the second image sensor 750 of the optical imaging system 500 of the 3D image acquisition apparatus 700 shown in FIG. 1 may include an organic photoelectric device including a first light-transmitting electrode 201R, a second light-transmitting electrode 10IR facing the first light-transmitting electrode 201R, and a photoactive layer 301R disposed between the first light-transmitting electrode 201R and second light-transmitting electrode 10IR and including a material that selectively senses light in an infrared region, as shown in FIG. 7.

In such an embodiment, the photoactive layer 301R including a material that selectively senses light in an infrared region may include a p-type semiconductor material that selectively absorbs the light in an infrared region, and an n-type semiconductor material that forms a PN junction with the p-type semiconductor material.

The p-type semiconductor material that selectively absorbs light in an infrared region may be, for example, a phthalocyanine-based compound capable of absorbing light in a wavelength band of greater than or equal to about 700 nm as a semiconductor material in which holes becomes a plurality of carriers. In one embodiment, for example, the phthalocyanine-based compound may include tin-based, aluminum-based, sodium-based, cesium-based and manganese-based phthalocyanine compounds, oxy titanium phthalocyanine, and the like. In an embodiment, the tin-based phthalocyanine compound may be SnPC that shows light absorption characteristics at a wavelength band in a range from about 600 nm to about 900 nm.

In one embodiment, for example, the n-type semiconductor material may include fullerenes such as $C_{60}$ or $C_{70}$ and the like as a semiconductive organic material in which electrons becomes a plurality of carriers.

Alternatively, the n-type semiconductor material may include naphthalene tetracarboxylic anhydride ("NTCDA"), Alq3, bis(benzoquinoline)berellium ("Bebq2"), and the like.

The first light-transmitting electrode 201R and the second light-transmitting electrode 10IR of the second image sensor may be respectively substantially the same as the first pixel electrode 120 and the second pixel electrodes 110B, 110R and 110G of the first image sensor illustrated in FIG. 2, and any repetitive detailed description thereof will be omitted.

In such an embodiment, a visible light absorption layer (not shown) including a material that absorbs light in a visible light wavelength region may be further disposed on the first light-transmitting electrode 201R of the second image sensor 750. In an embodiment, the visible light absorption layer may be selectively provided to block the light in a visible wavelength region on the first light-transmitting electrode 201R of the second image sensor 750, even though the light in a visible wavelength region rarely reaches the second image sensor 750 without being absorbed in the first image sensor 730. Alternatively, a time-of-flight ("TOF") sensor may be additionally disposed on the second image sensor 750 to modulate illumination light or infrared light entering through the second image sensor 750.

In an embodiment, the first image sensor 730 of the optical imaging system 500 for a 3D image acquisition apparatus may include an organic photoelectric device including a material that absorbs and senses light in a certain or specific visible light region. In such an embodiment, the second image sensor 750 may not include the organic photoelectric device. In such an embodiment, the second image sensor 750 disposed in the rear of the first image sensor 730 may include an inorganic photoelectric device, for example, a charge-coupled device ("CCD") or a complementary metal oxide semiconductor ("CMOS"), unlike the first image sensor 730 that is disposed in front of the second image sensor 750, and absorbs light in a visible light region and transfers the rest of light to the second image sensor 750.

The first image sensor 730 senses light in a visible light region to generate a color image, thus the first image sensor 720 includes a plurality of pixels that senses light in blue, green and red wavelength regions, converts the amount of incident light into an electrical signal for each of the pixels, and then outputs the electrical signal. The first image sensor 730 for generating a color image may have higher resolution compared to the second image sensor 750 for generating a depth image having depth information only. Accordingly, the second image sensor 750 may be smaller than the first image sensor 730. When the sizes of the first image sensor 730 and the second image sensor 750 are different from each other, the color image generated by the first image sensor 730 and the depth image generated by the second image sensor 750 may have different fields of view. In such an embodiment, the first image sensor 730 having the larger size may generate a color image having a wide field of view, and the second image sensor 750 may generate a depth image having a narrow field of view. Thus, in such an embodiment, a reducing optical system (not shown), of which magnification is less than 1, for reducing an image may be further disposed between the first image sensor 730 and the second image sensor 750 to match the fields of view of between the first image sensor 730 and the second image sensor 750. In an embodiment, where the reducing optical system is included, an image reduced by the reducing optical system is incident on the second image sensor 750, so that a field of view of an image generated by the second image sensor 750 may be widened by the reduction.

As described herein, an embodiment of the optical imaging system 500 including the first image sensor 730 that includes an organic photoelectric device and generates a color image, and the second image sensor 750 that senses the rest of the illumination light reflected from objects after the light thereof in a visible light region is absorbed in the first image sensor 730 and generates a stereoscopic image may be included in various 3D image acquisition apparatuses, e.g., a 3D camera, a range-finding device, a gesture recognizer, a game console, and the like, but are not limited thereto.

An alternative embodiment of the optical imaging system 500 for the 3D image acquisition apparatus 700 include the object lens 720, the first image sensor 730 and the second image sensor 750 as shown in FIG. 1 may further include an optical shutter module 740 (shown in FIG. 8) that is disposed between the first image sensor 730 and the second image sensor 750 and transmits illumination light, for example, light in an infrared region out of the light transmitted from the first image sensor 730.

Figure 8:
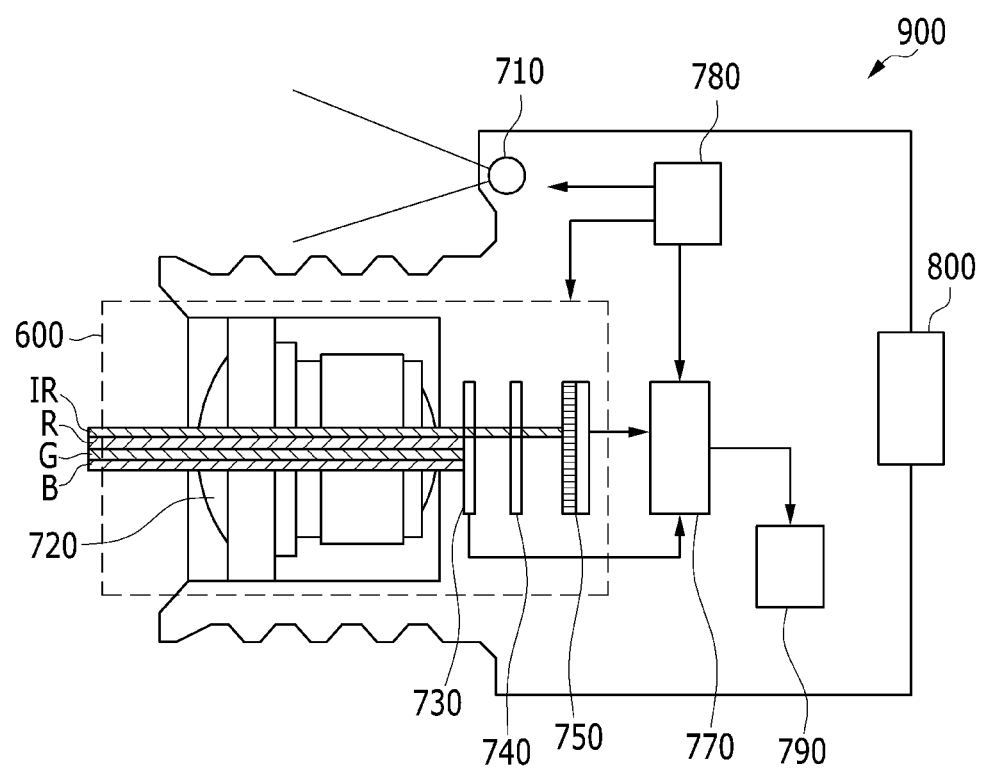
FIG. 8 is a schematic view exemplarily showing structures of an alternative embodiment of an optical imaging system for a 3D image acquisition apparatus and an embodiment of a 3D image acquisition apparatus including the optical imaging system, according to the invention.

FIG. 8 is a schematic view showing an embodiment of an optical imaging system 600 for a 3D image acquisition apparatus, according to the invention, and the structure of an embodiment of a 3D image acquisition apparatus 900 including the optical system 600.

Referring to FIG. 8, an embodiment of a 3D image acquisition apparatus 900 according to the invention includes a light source 710 that generates illumination light having a predetermined wavelength, an object lens 720 that focuses visible light and the illumination light reflected from an external object (not shown), a first image sensor 730 that senses visible light focused by the object lens 720 and generates a color image, an optical shutter module 740 that transmits illumination light of light transmitted from the first image sensor 730, a second image sensor 750 configured to sense illumination light emitted from the optical shutter module 740 and generates a depth image, a video signal processor 770 that generates a 3D image using the color image and depth image, and a controller 780 that controls operations of the light source 710, the first image sensor 730, the optical shutter module 740, the second image sensor 750 and the video signal processor 770. In such an embodiment, the 3D image acquisition apparatus 900 may further include a memory 790 for storing a final 3D image and a display panel 800 for displaying the final 3D image.

In an embodiment of FIG. 8 as indicated as a dotted line, the object lens 720, the first image sensor 730, the optical shutter module 740 and the second image sensor 750 may define the optical imaging system 600 of the 3D image acquisition apparatus 900. The optical shutter module 740 may be disposed at the rear of the first image sensor 730 that senses light in a visible light band, and the optical shutter module 740 may transmit illumination light, for example, light in an infrared ray band out of the light transmitted through the first image sensor 730 toward the second image sensor 750. In an embodiment, the first image sensor, the optical shutter module and the second image sensor may be sequentially arranged to be substantially perpendicular to an optical axis of the optical imaging system 600 along the optical axis.

In an embodiment of the 3D image acquisition apparatus 900, as shown in FIG. 8, light in a visible light band of light focused by the object lens 720 is sensed by the first image sensor 730 to generate a color image. As described above referring to FIGS. 2 to 6, the first image sensor 730 may include a plurality of pixel parts, e.g., color pixels including an organic photoelectric device including a material that senses light in a visible light region. Accordingly, light in a visible light region of light focused by the object lens 720 is mainly absorbed by organic photoelectric devices of the first image sensor 730 including a material that selectively absorbs light in a visible light region, and other light except visible light transmits through the first image sensor 730 and is transferred to the optical shutter module 740. The optical shutter module 740 may transmit illumination light, for example, light in an infrared region, for example, light in a near infrared region, that is, light having a wavelength in a range from about 700 nm to about 1100 nm, or from about 800 nm to about 1100 nm, out of the rest of light, and thus only the light in an infrared region passed through the optical shutter module 740 may reach the second image sensor 750, and a depth image is thereby generated by the second image sensor 750.

As described above, an embodiment of the optical imaging system 600 for the 3D image acquisition apparatus 900 includes the first image sensor 730 that senses light in a visible light region in the rear of the object lens 720, the optical shutter module 740 that transmits light in an infrared ray band in the rear of the first image sensor 730, and the second image sensor 750 that senses in an infrared ray band in the rear of the optical shutter module 740, such that the optical shutter module 740 effectively operates without a separate complex structure for separating visible light from illumination light, that is, the visible light from infrared light. In such an embodiment, the first image sensor 730 includes a material that selectively absorbs visible light and thus absorbs most of the visible light passing through the first image sensor 730, while the rest of light including infrared light passes through the optical shutter module 740, and accordingly, the optical shutter module 740 effectively operates without a separate constituent that separates the visible light from the incident light to transmits the infrared light to the second image sensor 750. In such an embodiment, the second image sensor 750 selectively absorbs and senses only the infrared light, and the optical shutter module 740 may operates without a constituent for separating the visible light and the infrared light from the incident light in the optical imaging system 600 for a 3D image acquisition apparatus 900, and thus the optical shutter module 740 may have a reduced size, e.g., the optical imaging system 600 and the 3D image acquisition apparatus 900 may be manufactured to be thinner. Accordingly, the 3D image acquisition apparatus 900 may be efficiently manufactured with a lower cost.

The optical shutter module 740 may be manufactured by any material capable of transmitting the illumination light, that is, light in an infrared region of light passing through the first image sensor 730, without any additional constituent for separating illumination light, or light in an infrared region from visible light or light in other regions.

In an embodiment, a wavelength selectivity mirror, that is, a reflection layer for reflecting the visible light may be further disposed on a side or both sides of the optical shutter module 740, e.g., on a surface of the optical shutter module 740 facing the first image sensor 730 to more efficiently transmit light in an infrared region by removing a part of light in a visible light region that is not absorbed in the first image sensor 730. Herein, a part of the light not absorbed in but transmitted from the first image sensor 730 may be reflected at the wavelength selectivity mirror and removed, but light in an infrared ray wavelength region passes through the wavelength selectivity mirror and goes through an optical shutter that modulates the light in an infrared ray band, and then is sensed by the second image sensor 750. In an embodiment, the optical shutter modulates the illumination light transmitted first from the image sensor, for example, infrared light, into a predetermined gain waveform according to a TOF method to acquire depth information with respect to an object. In one embodiment, for example, the optical shutter may be a GaAs-based semiconductor modulator used for high-speed drive at several tens to several hundreds of megahertz.

In an embodiment of the 3D image acquisition apparatus 900 shown in FIG. 8, the light source 710, the object lens 720, the first image sensor 730, the second image sensor 750, the video signal processor 770, the controller 780, the memory 790, the display panel 800 for displaying a 3D image, and the like are the same as those illustrated in FIGS. 1 to 7, and any repetitive detailed description thereof will be omitted.

Figure 9:
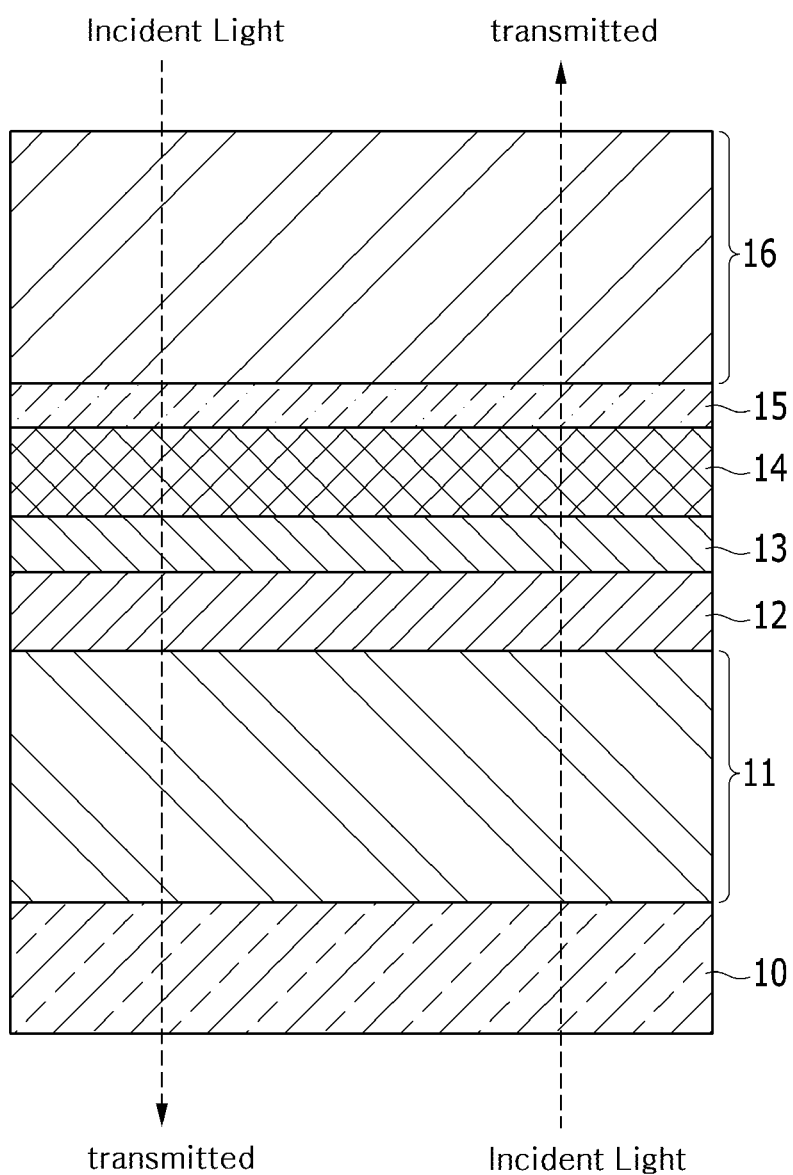
FIG. 9 is a schematic view of an embodiment of an optical shutter module in an optical imaging system for a 3D image acquisition apparatus, according to the invention.

FIG. 9 is a schematic view showing the structure of an embodiment of an optical shutter module 740 according to the invention.

Referring to FIG. 9, an embodiment of the optical shutter module 740 includes first and second reflection layers 11 and 16 which are disposed on a substrate 10 and reflect light in a certain or specific wavelength band corresponding thereto, for example, light in a visible light region, a crystalline electro-optical thin film layer 14 disposed between the first and second reflection layers 11 and 16 and having a changing refractive index depending on an electric field, first and second electrodes 12 and 15 that are disposed between the first and second reflection layers 11 and 16 and spaced apart from each other with the electro-optical thin film layer 14 disposed therebetween and apply an electric field to the electro-optical thin film layer 14, and an electric current prevention layer 13 disposed in a region of between the first electrode 12 and the electro-optical thin film layer 14 or between the second electrode 15 and the electro-optical thin film layer 14 to prevent a current from flowing into the electro-optical thin film layer 14.

The substrate 10 may include or be formed of a transparent amorphous material capable of transmitting light, for example, glass, sapphire, silicon, Group III-V GaAs, and the like. The material of the substrate 10 may be selected depending on a light wavelength band for modulation or based on the type of the optical shutter module, e.g., whether the optical shutter module is a reflection type or a transmission type.

In an embodiment, the first and second reflection layers 11 and 16 may have high reflectance regarding light in a certain or specific wavelength band by alternatively stacking two kinds of transparent dielectric material thin films having different refractive indexes from each other. In such an embodiment, a layer simultaneously having transmittance and reflection characteristics of light such as a thin metal and the like instead of a dielectric material thin film may be used as the first and second reflection layers 11 and 16. In an embodiment, the first reflection layer 11 and the second reflection layer 16 may be substantially the same as each other, e.g., have the same material with the same structure, and the first reflection layer 11 or the second reflection layer 16 may be omitted.

The first reflection layer 11 and the second reflection layer 16 may have the same reflectance of greater than or equal to about 97%. Then, light in a narrow wavelength band corresponding to a resonance mode may be transmitted, while incident light is resonant between the first reflection layer 11 and the second reflection layer 16 with the electro-optical thin film layer 14 in the middle. Accordingly, a structure including the first reflection layer 11, the electro-optical thin film layer 14 and the second reflection layer 16 are a Fabry-Perot filter having controllable short wavelength transmittance characteristics. The wavelength band of the transmitted light may be controlled depending on the refractive index and thickness of the electro-optical thin film layer 14.

The electro-optical thin film layer 14 may include or be formed of a material having a refractive index that is changed when an electric field is applied thereto, that is, a material showing an electro-optic ("EO") effect, and such a material may change the wavelength of resonated light depending on a magnitude of the electric field. Such a material may include, for example, at least one of $KTN$, $LiNbO_3$, PZT, PLZT and liquid crystal.

The electro-optical thin film layer 14 may include or be formed of a material having a light absorption rate that is changed when an electric field is applied thereto, that is, a material showing an electro-absorption ("EA") effect. In one embodiment, for example, the electro-optical thin film layer 14 may have a multiple quantum well ("MQW") structure by using a Group III-V semiconductor and thus using a property that an absorption wavelength in the MQW is shifted according to application of an electric field.

The first electrode 12 and the second electrode 15 are disposed to apply a voltage, so that an electric field is formed in the electro-optical thin film layer 14 including a transparent conductive material.

The electric current prevention layer 13 prevents an electric current of at least one of the first and second electrodes 12 and 15 from flowing into the electro-optical thin film layer 14. The electric current prevention layer 13 may include or be formed of an insulating material including at least one of $ZrO_2$, $TiO_2$, MgO, $CeO_2$, $Al_2Oe$, $HfO_2$, NbO, $SiO_2$ and $Si_3N_4$. In such an embodiment, the insulating material of the electric current prevention layer 13 may be differently selected based on material characteristics of the electro-optical thin film layer 14.

The electric current prevention layer 13 may be disposed between the first electrode 12 and the electro-optical thin film layer 14 as shown in FIG. 9. However, the electric current prevention layer 13 may also be disposed between the electro-optical thin film layer 14 and the second electrode 15. Alternatively, the electric current prevention layer 13 may be disposed between the first electrode 12 and the electro-optical thin film layer 14 and between the second electrode 15 and the electro-optical thin film layer 14.

While the disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. An optical imaging system for a three-dimensional image acquisition apparatus, the optical imaging system comprising:
   an object lens which focuses light;
   a first image sensor which senses light in a visible light band of the light focused by the object lens; and
   a second image sensor which senses light in an infrared ray band of light transmitted through the first image sensor,
   wherein the first image sensor comprises an organic image sensor, in which a plurality of pixel parts are defined to be arranged in a matrix,
   wherein the organic image sensor comprises:
      a plurality of second pixel electrodes arranged apart from each other and corresponding to the plurality of pixel parts in one to one correspondence;
      a photoactive layer disposed on the second pixel electrodes and in a form of a continuous film, wherein the photoactive layer comprises an organic material which senses light in a full visible light region, and overlapping all the plurality of second pixel electrodes;
      a first pixel electrode disposed on the photoactive layer and in a form of a continuous film, overlapping all the plurality of second pixel electrodes, and is disposed at a light incidence side;
      a plurality of color filters disposed on the first pixel electrode in positions corresponding to the plurality of pixel parts, and each of which transmits light in a certain wavelength region to be sensed by a pixel part corresponding thereto, and
      an optical shutter module disposed between the first image sensor and the second image sensor and which transmits the light in the infrared ray band of the light transmitted through the first image sensor to the second image sensor,
   wherein the optical shutter module comprises:
      a wavelength selectivity mirror which reflects the light in the visible light band and transmits the light in the infrared ray band; and
      an optical shutter which modulates the light in the infrared ray band into a predetermined gain waveform, and
   wherein the object lens corresponds to the plurality of pixel parts in one to plural correspondence.
2. The optical imaging system of claim 1, wherein
   the plurality of color filters comprise a first color filter, a second color filter and a third color filter,
   the first color filter selectively transmits light having a wavelength in a range of 400 nm to 500 nm,
   the second color filter selectively transmits light having a wavelength in a range of 500 nm to 580 nm, and
   the third color filter selectively transmits light having a wavelength in a range 580 nm to 700 nm.

3. The optical imaging system of claim 1, wherein
the first image sensor comprises a blue pixel, a green pixel and a red pixel,
each of the blue pixel, green pixel and the red pixel comprises:
   a first light-transmitting electrode disposed at a light incidence side;
   a second light-transmitting electrode facing the first light-transmitting electrode; and
   a photoactive layer interposed between the first light-transmitting electrode and the second light-transmitting electrode,
the photoactive layer of the blue pixel comprises an organic material which absorbs light in a blue wavelength region,
the photoactive layer of the green pixel comprises an organic material which absorbs light in a green wavelength region, and
the photoactive layer of the red pixel comprises an organic material which absorbs light in a red wavelength region.

4. The optical imaging system of claim 3, wherein
the blue pixel, the green pixel and the red pixel are horizontally adjacent to one another.

5. The optical imaging system of claim 3, wherein
two of the blue pixel, the green pixel and the red pixel are horizontally adjacent to each other, and
the other color pixel of the blue pixel, the green pixel and the red pixel is vertically disposed on a layer defined by the two of the blue pixel, the green pixel and the red pixel.

6. The optical imaging system of claim 5, wherein
the blue pixel and the red pixel are horizontally adjacent to each other, and
the green pixel is vertically disposed on a layer defined by the blue pixel and the red pixel.

7. The optical imaging system of claim 3, wherein
the blue pixel, the green pixel, and the red pixel are vertically disposed one on another.

8. The optical imaging system of claim 7, wherein
the blue pixel, the green pixel, and the red pixel are sequentially disposed one on another from the object lens.

9. The optical imaging system of claim 3, wherein
the organic material of the photoactive layer of the blue pixel has a maximum absorption wavelength ($\lambda$max) in a range of 400 nm to 500 nm,
the organic material of the photoactive layer of the green pixel has a maximum absorption wavelength ($\lambda$max) in a range of 500 nm to 580 nm, and
the organic material of the photoactive layer of the red pixel has a maximum absorption wavelength ($\lambda$max) in a range of 580 nm to 700 nm.

10. The optical imaging system of claim 1, wherein the second image sensor comprises:
   a first light-transmitting electrode disposed at a light incidence side;
   a second light-transmitting electrode facing the first light-transmitting electrode; and
   a photoactive layer interposed between the first light-transmitting electrode and the second light-transmitting electrode, wherein the photoactive layer comprises an organic material which absorbs the light in the infrared ray band.

11. The optical imaging system of claim 1, wherein
the second image sensor comprises a silicon photodiode which senses the light in the infrared ray band.

12. The optical imaging system of claim 1, wherein the first image sensor, the optical shutter module and the second image sensor are sequentially arranged to be perpendicular to an optical axis along the optical axis.

13. A three-dimensional image acquisition apparatus, comprising:
   the optical imaging system of claim 1;
   a light source which generates the light in the infrared ray band and irradiates the light in the infrared ray band onto an object;
   a video signal processor which generates a three-dimensional image using first and second video signals respectively from the first image sensor and the second image sensor of the optical imaging system; and
   a controller which controls operations of the light source and the video signal processor.

14. A three-dimensional camera comprising the three-dimensional image acquisition apparatus of claim 13.

15. A range-finding device comprising the three-dimensional image acquisition apparatus of claim 13.

16. A gesture recognizer comprising the three-dimensional image acquisition apparatus of claim 13.

17. A game console comprising the three-dimensional image acquisition apparatus of claim 13.

* * * * *